United States Patent [19]
Sherman

[11] Patent Number: 5,916,365
[45] Date of Patent: Jun. 29, 1999

[54] SEQUENTIAL CHEMICAL VAPOR DEPOSITION

[76] Inventor: Arthur Sherman, 600 Sharon Park Dr., Suite C-307, Menlo Park, Calif. 94025

[21] Appl. No.: 08/699,002

[22] Filed: Aug. 16, 1996

[51] Int. Cl.[6] .................................................. C30B 25/14
[52] U.S. Cl. ................................................ 117/92; 117/93
[58] Field of Search ................................ 117/88, 89, 92, 117/103, 104, 940, 950, 952

[56] References Cited

U.S. PATENT DOCUMENTS

| | | | |
|---|---|---|---|
| 4,058,430 | 11/1977 | Suntola et al. | 156/611 |
| 4,389,973 | 6/1983 | Suntola et al. | 118/725 |
| 4,767,494 | 8/1988 | Kobayashi | 156/606 |
| 4,845,049 | 7/1989 | Sunakawa | 437/81 |
| 4,859,627 | 8/1989 | Sunakawa | 437/81 |
| 4,876,218 | 10/1989 | Pessa et al. | 437/107 |
| 4,993,357 | 2/1991 | Scholz | 118/715 |
| 5,060,595 | 10/1991 | Ziv et al. | 118/722 |
| 5,071,670 | 12/1991 | Kelly | 427/38 |
| 5,130,269 | 7/1992 | Kitahara et al. | 437/111 |
| 5,166,092 | 11/1992 | Mochizuki et al. | 437/105 |
| 5,225,366 | 7/1993 | Yoder | 437/108 |
| 5,256,244 | 10/1993 | Ackerman | 156/613 |
| 5,270,247 | 12/1993 | Sakuma et al. | 437/133 |
| 5,693,139 | 12/1997 | Nishizawa et al. | 117/89 |

OTHER PUBLICATIONS

Bedair,S.M., J. Vac. Sci. Technol., B 12(1), 179 (1994).
Higashi,G.S. and Fleming,C.G., Appl. Phys. Lett., 55(19), 1963 (1989).
Nishizawa,J. et al, J. Electrochem. Soc., 134, 945 (1987).
Nishizawa,J. et al, J. Electrochem. Soc., 132, 1197 (1985).
Nishizawa,J. et al, J. Vac. Sci. Technol., A 4(3), 706 (1986).
Hiltunin, L. et al, Thin Solid Films, 166, 149 (1988).
Hiltunin, L. et al, Materials Chemistry and Physics, 28, 379 (1991).
Leskela,M., Acta Polytechnica Scandinavica, Ch 195, 67 (1990).
Asikainen,T. et al, J. Electrochem. Soc., vol. , 1 (1994).
Kumagai,H. et al, Jpn. J. Appl. Phys. 33, 7086 (1994).
Sneh,O. et al, Surface Science 334, 135 (1995).
Ritala,M., et al, Thin Solid Films 250, 72 (1994).
Leskela,M. et al, J. Less Common Metals 153, 219 (1989).
Tammenmaa,M. et al, J. Crystal Growth 84, 151 (1987).
Leskela,M. et al, Mat. Res. Soc. Symp. Proc. 222, 315 (1991).
Leskela,M. et al, Chemtronics, 3, 113 (1988).
Ritala,M., et al, Thin Solid Films 225, 288 (1993).
Ritala, M., et al, Thin Solid Films 228, 32 (1993).
Ritala,M., et al, Chem. Mater. 5, 1174 (1993).
J.F.Fan, et al, Mat. Res. Soc Symp. Proc. 222, 327 (1991).
*Atomic Layer Growth and Processing*, Eds. T.F.Kuech, P.D.Dapkus, and Y.Aoyagi, Mat. Res. Soc. Proc. 222, 1991.
*Atomic Layer Epitaxy*, Eds. T.Suntola and M.Simpson, Chapman and Hall, NY 1990.
Sherman,A. *Chemical Vapor Deposition for Microelectronics*, Noyes Publications, New Jersey, 1987.
*Proceedings of the Second International Atomic Layer Epitaxy Symposium*, Thin Solid Films, vol. 225(1–2), (1993).

(List continued on next page.)

*Primary Examiner*—R. Bruce Breneman
*Assistant Examiner*—Alva C. Powell
*Attorney, Agent, or Firm*—Wilson Sonsini Goodrich & Rosati; Robert Moll

[57] ABSTRACT

The present invention provides for sequential chemical vapor deposition by employing a reactor operated at low pressure, a pump to remove excess reactants, and a line to introduce gas into the reactor through a valve. A first reactant forms a monolayer on the part to be coated, while the second reactant passes through a radical generator which partially decomposes or activates the second reactant into a gaseous radical before it impinges on the monolayer. This second reactant does not necessarily form a monolayer but is available to react with the monolayer. A pump removes the excess second reactant and reaction products completing the process cycle. The process cycle can be repeated to grow the desired thickness of film.

20 Claims, 3 Drawing Sheets

OTHER PUBLICATIONS

*Proceedings of the Third International Atomic Layer Epitaxy Symposium*, Applied Surface Science, vol. 82/83, (1994).

Sherman, A., "Chemical Vapor Depostion for Microelectronics," Noyes Publication, New Jersey, 1987.

Kumagai, H., Toyoda, K., Matsumoto, M., Ohara, M., "Comparative Study of $Al_2 O_3$ Optical Crystalline Thin Films Grown by Vapor Combinations of $Al(CH_3)_3/N_2O$ and $Al(CH_3)_3/H_2O_2$", Jpn. Appl. Phys. vol. 32, 6137, 1993.

Leskela, M., "Atomic Layer Epitaxy in the Growth of Polycrystalline and Amorphous Films" Acta Polytechnica Scandinvica, Chapter 195, 1990.

Bedair, S.M. Atomic Layer Epitaxy Deposition Process, J. Vac. Sci Technol. B 12(1), 179, 1994.

Ehrlich, D.J., Melngailis, J., "Fast Room–Temperature Growth of $SiO_2$ Films by Molecular–layer Dosing", Appl. Phys. LeH. 58 2675, 1991.

Fan, J.F., Sugioka, K., Toyoda, K., "Low–Temperature Growth of Thin Films of $Al_2D_3$ with Trimethylaluminum and Hydrogen Peroxide", Mat. Res. Soc. Symp. Proc. 222, 327, 1991.

Nakano, M., Sakaue, H., Kawamoto, A., Nagata, A., Hirose, M., "Digital Chemical Vapor Deposition of $SiO_2$", Appl. Phys. Lett. 57, 1096, 1990.

Hiramatsu, K., Ohnichi, H., Takahama, T., Yamanshi, K. "Formation of TiN Films with Low Cl Concentration by Pulsed Plasma Chemical Vapor Deposition", J. Vac. Sci Techn. A14(3), 1037, 1996.

Levy, R.A., Green, M.L., "Low Pressure Chemical Vapor Deposition of Tungsten and Aluminum for VLSI Applications," J. Electrochem Soc, vol. 134, 37C, 1987.

Kondon, E., Kawano, Y., Takeyasu, N., Ohta, T. "Interconnection Formation by Doping Chemical–Vapor–Depostion Aluminum with Copper Simultaneously:Al–Cu CVD," J. Electro Chem. Soc. vol. 141, 3494, 1994.

Jensen, K.F., Cullen, G.W. "Proceedings of the Twelfth International Symposium on Chemical Vapor Deposition 1993," Proceedings vol. 93–2, The Electrochemical Society, Pennington, N.J., 1993.

"Corrosion of Aluminum and Aluminum Alloys," vol. 13 of Metals Handbook, ASM, Metals Park, OH, 1989.

Sherman, A. "In situ Removal of Native Oxide from Silicon Wafers," J. Vac. Sci. Technol. vol. B8(4) 656 (Jul./Aug. 1990).

Bermudez, V.M., "Simple, Efficient Technique for Exposing Surfaces to Hydrogen Atoms," J. Vac. Sci. Technol. vol A14,2671, 1996.

SEQUENTIAL CHEMICAL VAPOR DEPOSITION

BACKGROUND OF THE INVENTION

The present invention relates to methods and apparatuses suited to the low temperature deposition of solid thin films of one or more elements by the technique of sequentially exposing the object being coated with chemically reactive gaseous species. It also describes a number of applications of films produced by such processes.

CVD Reactor Technology

Chemical vapor deposition (CVD) reactors have been used for decades to deposit solid thin films and typical applications are coating tools, manufacture of integrated circuits, and coating jewelry. A. Sherman, *Chemical Vapor Deposition for Microelectronics,* Noyes Publications, New Jersey, 1987. Up to the 1960's many CVD reactors operated by exposing a heated object or substrate to the steady flow of a chemically reactive gas or gases at either atmospheric or reduced pressures. Since, in general, it has been desired to deposit films at as high a rate as possible as well as at as low a temperature as practical, the gases used to produce the film are extremely reactive (e.g., silane plus oxygen to deposit silicon dioxide). Then if the gases are allowed to mix for too long a time period before impinging the substrate, gas phase reactions can occur, and in extreme cases there can be gas phase nucleation and particles formed rather than deposition of continuous films. At the same time, the high rate of deposition and the reactive gases used makes it very difficult to coat large area substrates uniformly. This results in very complex and expensive commercial CVD reactors. A further complication with this method is that in some cases the films deposited do not conformally coat non-uniform surfaces. This can be particularly deleterious in the manufacture of integrated circuits.

In the 1960's it was realized that we could lower the temperature required for thin film deposition at acceptable rates by creating a low pressure glow discharge in the reactive gas mixture. The glow discharge produces many high energy electrons that partially decompose the reactive gases, and these gas fragments (radicals) are very reactive when they impinge on a surface even at moderate temperatures. Although using a glow discharge allows lower temperature operation, commercial reactors are very complex and expensive, since uniform deposition over large area substrates is even more difficult due to the inherent nonuniformity of glow discharges and due to the added expense of complex high frequency power supplies. Also, this technique can often lead to degradation of the film conformality, due to the highly reactive nature of the radicals.

In the 1970's atomic layer epitaxy (ALE) was developed in Finland by T. Suntola and J. Anston. U.S. Pat. No. 4,058,430 describes how they grew solid thin films on heated objects. This process involves exposing the heated surface to a first evaporated gaseous element, allowing a monolayer of the element to form on the surface, and then removing the excess by evacuating the chamber with a vacuum pump. When a layer of atoms or molecules one atom or molecule thick cover all or part of a surface; it is referred to as a monolayer. Next, a second evaporated gaseous element is introduced into the reactor chamber. The first and second elements combine to produce a solid thin compound monolayer film. Once the compound film has been formed, the excess of the second element is removed by again evacuating the chamber with the vacuum pump. The desired film thickness is built up by repeating the process cycle many (e.g., thousands) times.

An improvement to this technique was described in a later patent issuing in 1983 to T. Suntola, A. Paakala and S. Lindfors, U.S. Pat. No. 4,389,973. Their films were grown from gaseous compounds rather than evaporated elements so the process more closely resembles CVD. This was recognized to be especially advantageous when one component of the desired film is a metal with low vapor pressure, since evaporation of metals is a difficult process to control. With this approach, films were deposited by flow reactors similar to a conventional CVD reactor, where the excess of each gas is removed by flowing a purge gas through the reactor between each exposure cycle. This approach was limited to only a few films, depending on the available gaseous precursors, and all of these films were not as contamination free as desired. We will refer to this process as sequential chemical vapor deposition.

An alternative approach to operating a sequential chemical vapor deposition reactor would be to operate a non-flow vacuum system where the excess gaseous compound of each sequence is removed by vacuum pumps in a manner similar to the original Suntola 1977 process. H. Kumagai, K. Toyoda, M. Matsumoto and M. Obara, *Comparative Study of $Al_2O_3$ Optical Crystalline Thin Films Grown by Vapor Combinations of $Al(CH_3)_3/N_2O$ and $Al(CH_3)_3/H_2O_2$*, Jpn. Appl. Phys. Vol. 32, 6137 (1993).

An early application of sequential chemical vapor deposition was for deposition of polycrystalline ZnS thin films for use in electrochromic flat panel displays. M. Leskela, *Atomic Layer Epitaxy in the Growth of Polycrystalline and Amorphous Films,* Acta Polytechnica Scandinvica, Chapter 195, 1990. Additional studies have shown that other commercially important solid films of different compounds, amorphous and polycrystalline, can be deposited by this technique on large area glass substrates. Among these other films are sulfides (strontium sulfide, calcium sulfide), transition metal nitrides (titanium nitride) and oxides (indium tin oxide, titanium dioxide). Elsewhere, this technique has been developed as a means of depositing epitaxial layers of group III-V (gallium indium phosphide) and group II-VI (zinc selenide) semiconductors, as an alternative to the much more expensive molecular beam epitaxy process.

To applicant's knowledge the only literature discussing sequential chemical vapor deposition of elemental films are those that deposit elemental semiconductors in group IVB such as silicon and germanium. One such study, S. M. Bedair, *Atomic Layer Epitaxy Deposition Process,* J. Vac. Sci. Technol. B 12(1), 179 (1994) describes the deposition of silicon from dichlorosilane and atomic hydrogen produced by a hot tungsten filament. By operating the process at 650° C. deposition of epitaxial films are described. Deposition of diamond, tin and lead films, in addition to silicon and germanium by an extraction/exchange method in conjunction with a sequential processing scheme similar to sequential chemical vapor deposition has also been reported M. Yoder, U.S. Pat. No. 5,225,366. Also although some of the studies reported have explored processes that may be useful at moderate temperatures, most require undesirably high substrate temperatures (~300–600° C.) to achieve the desired sequential chemical vapor deposition growth of high quality films.

Conformal Films Deposited at Low Temperatures for Integrated Circuit Manufacture A continuing problem in the commercial manufacture of integrated circuits is the achievement of conformal deposition of dielectric (e.g., silicon dioxide, silicon nitride) or conducting (e.g., aluminum, titanium nitride) thin solid films over large area wafers (e.g., 12 inches in diameter). A film is conformal when it exactly replicates the shape of the surface it is being deposited on.

In one recent paper by D. J. Ehrlich and J. Melngailis, *Fast Room-Temperature Growth of SiO$_2$ Films by Molecular-layer Dosing,* Appl. Phys. Lett. 58, 2675(1991) an attempt was reported of layer by layer deposition of silicon dioxide from silicon tetrachloride and water. Although the films appear to be very conformal, there is no discussion of film quality or density, and it is likely that these films are porous making them unsuitable for thin film applications. In support of this conclusion, we can refer to a recent study by J. F. Fan, K. Sugioka and K. Toyoda, *Low-Temperature Growth of Thin Films of Al$_2$O$_3$ with Trimethylaluminum and Hydrogen Peroxide,* Mat. Res. Soc. Symp. Proc. 222, 327 (1991). Here, aluminum oxide deposited at 150° C. was compared to deposition at room temperature. In this case, the room temperature films thickness reduced from 2270 Å to 1200 Å upon annealing at 150° C. for 15 minutes confirming the high porosity of the film deposited at room temperature. Another recent attempt to deposit silicon dioxide by sequential chemical vapor deposition used silane and oxygen by M. Nakano, H. Sakaue, H. Kawamoto, A. Nagata and M. Hirose, *Digital Chemical Vapor Deposition of SiO$_2$,* Appl. Phys. Lett. 57, 1096 (1990). Although these films, deposited at 300° C., appeared to be of better quality, they were not perfectly conformal, and could only fill holes of an aspect ratio up to 3:1. Modern integrated circuit technology requires the ability to coat holes and trenches with aspect ratios well in excess of 3:1.

Another technologically important thin solid film that needs to be deposited with high purity and at low temperature, conformally over large area wafers, is the multilayer film of titanium and/or titanium silicide plus titanium nitride. Here, the need is for a thin titanium and/or titanium silicide layer to be deposited on a silicon contact (~10 Å) followed by a layer of titanium nitride (~3–400 Å). In a recent paper by K. Hiramatsu, H. Ohnishi, T. Takahama and K. Yamanishi, *Formation of TiN Films with Low Cl Concentration by Pulsed Plasma Chemical Vapor Deposition,* J. Vac. Sci. Techn. A14(3), 1037 (1996), the authors show that an alternating sequence process can deposit titanium nitride films at 200° C. from titanium tetrachloride and hydrogen and nitrogen. However, the chlorine content of the films was ~1%, and no attempt was made to deposit pure titanium metal or titanium silicide. Also, the reactor used was very similar to the conventional expensive plasma enhanced CVD reactor.

Finally, sputtered aluminum films have been widely used to fabricate integrated circuits for many years. Unfortunately, sputtering is a line of sight deposition technique, so the films tend to be non-conformal. This has become more of a problem, in recent years, as denser circuit designs have resulted in holes of high aspect ratio that need to be filled. For this reason, many attempts have been made to find a suitable chemical vapor deposition process that would be highly conformal, and several processes have been successfully demonstrated by R. A. Levy and M. L. Green, *Low Pressure Chemical Vapor Deposition of Tungsten and Aluminum for VLSI Applications,* J. Electrochem. Soc. Vol. 134, 37C (1987). Although conformal thin films of aluminum can be deposited by CVD, these films are still not acceptable for use in circuits, because aluminum is susceptible to electromigration and it is necessary to add several percent of copper to these films to avoid this problem. All but one attempt to carry out the CVD process with copper precursors added to the aluminum precursors have been unsuccessful. See E. Kondoh, Y. Kawano, N. Takeyasu and T. Ohta, *Interconnection Formation by Doping Chemical-Vapor-Deposition Aluminum with Copper Simultaneously: Al—Cu CVD,* J. Electrochem. Soc. Vol. 141, 3494 (1994). The problem is that although there are CVD processes for the deposition of copper, the precursors used interact with the aluminum precursors in the gas phase preventing the simultaneous deposition of aluminum and copper.

Composite Fabrication

Many schemes have been developed to fabricate composite materials, because of the unusual strength of such materials. One approach to the fabrication of such materials is to prepare a cloth preform (i.e. from threads prepared from carbon fibers), and then expose this preform to a hydrocarbon gas at high temperatures. The hydrocarbon then pyrolyses with carbon depositing on the carbon preform. Unfortunately, this process is not very conformal, so that the outer pores of the preform are sealed before the interior can be coated, and the process has to be stopped prematurely. The preform then has to be machined to remove the outer layer, and further exposure is needed. This is a slow and very expensive process which is referred to in the literature as Chemical Vapor Infiltration (CVI); see e.g., *Proceedings of the Twelfth International Symposium on Chemical Vapor Deposition* 1993, eds. K. F. Jensen and G. W. Cullen, Proceedings Vol. 93-2, The Electrochemical Society, Pennington, N.J.

Coating Aluminum with Aluminum Oxide

As is well known, coating aluminum with a thin layer of oxide is an excellent way to protect this material from corrosion by the elements. The traditional way of doing this is to anodize the aluminum with a wet electrochemical process (*Corrosion of Aluminum and Aluminum Alloys,* Vol. 13 of Metals Handbook, ASM, Metals Park, Ohio, 1989). Pinholes and other defects in the anodized layer are the source of local failure of the corrosion protection of the anodized layer. Such pinholes occur because the wet anodization process relies on the underlying aluminum as the source of the aluminum in the aluminum oxide coating, and the underlying aluminum can have many impurities and defects. A preferred approach would be to deposit the desired aluminum oxide from an external source. Although using a CVD process to carry this out is an obvious choice, this has not been explored because the traditional CVD process operates at ~1000° C., and this far exceeds the melting point of the underlying aluminum.

Low Temperature Brazing

In the manufacture of high temperature, high density ceramics, there is great difficulty in fabricating unusual shapes to high accuracy. Most often the ceramic is formed in the "green" state, machined while still soft, and then fired at high temperature. After firing, the resulting high density ceramic part may require additional machining, for example, with diamond grinding wheels, to achieve the desired dimensional accuracy. In some cases, the part shape makes this additional machining difficult and expensive, and in some instances there may be no know way to reach the surface that needs to be ground. High temperature brazing of ceramic parts is an alternate technology for joining odd shapes of accurately finished ceramics. In some instances the braze metal may not be compatible with the desired application. Also the high temperature necessary for metal brazing makes it difficult to join parts of different thermal expansion coefficients. For example, it is not possible to braze aluminum to alumina ceramic, because the traditional brazing temperature would be far higher than the melting point of the aluminum.

SUMMARY OF THE INVENTION

In one embodiment, the present invention provides a reactor operated at low pressure, a pump to remove excess reactants, and a line to introduce gas into the reactor through a valve. In this embodiment, a first reactant forms a monolayer on the part to be coated, while the second reactant passes through a radical generator which partially decomposes or activates the second reactant into a gaseous radical before it impinges on the monolayer. This second reactant does not necessarily form a monolayer but is available to react with the monolayer. A pump removes the excess second reactant and reaction products completing the process cycle. The process cycle can be repeated to grow the desired thickness of film.

Because the film can be deposited one molecular layer at a time, the film forming on the part tends to be conformal and have uniform thickness. The present invention may use inexpensive reactors that can coat many parts simultaneously reducing costs. For the formation of a three-element film, an additional step introduces a third reactant in the process cycle. A stable compound film of any number of elements can be formed by growing the monolayers of the elements with gaseous precursors that contain the elements. Such precursors can be halides or organometallic compounds.

It is an object of the invention to facilitate the growth of thin films of any element by using a radical generator to make available highly reactive gases (radicals).

DETAILED DESCRIPTION OF THE PREFERRED EMBODIMENTS

Figure 1:
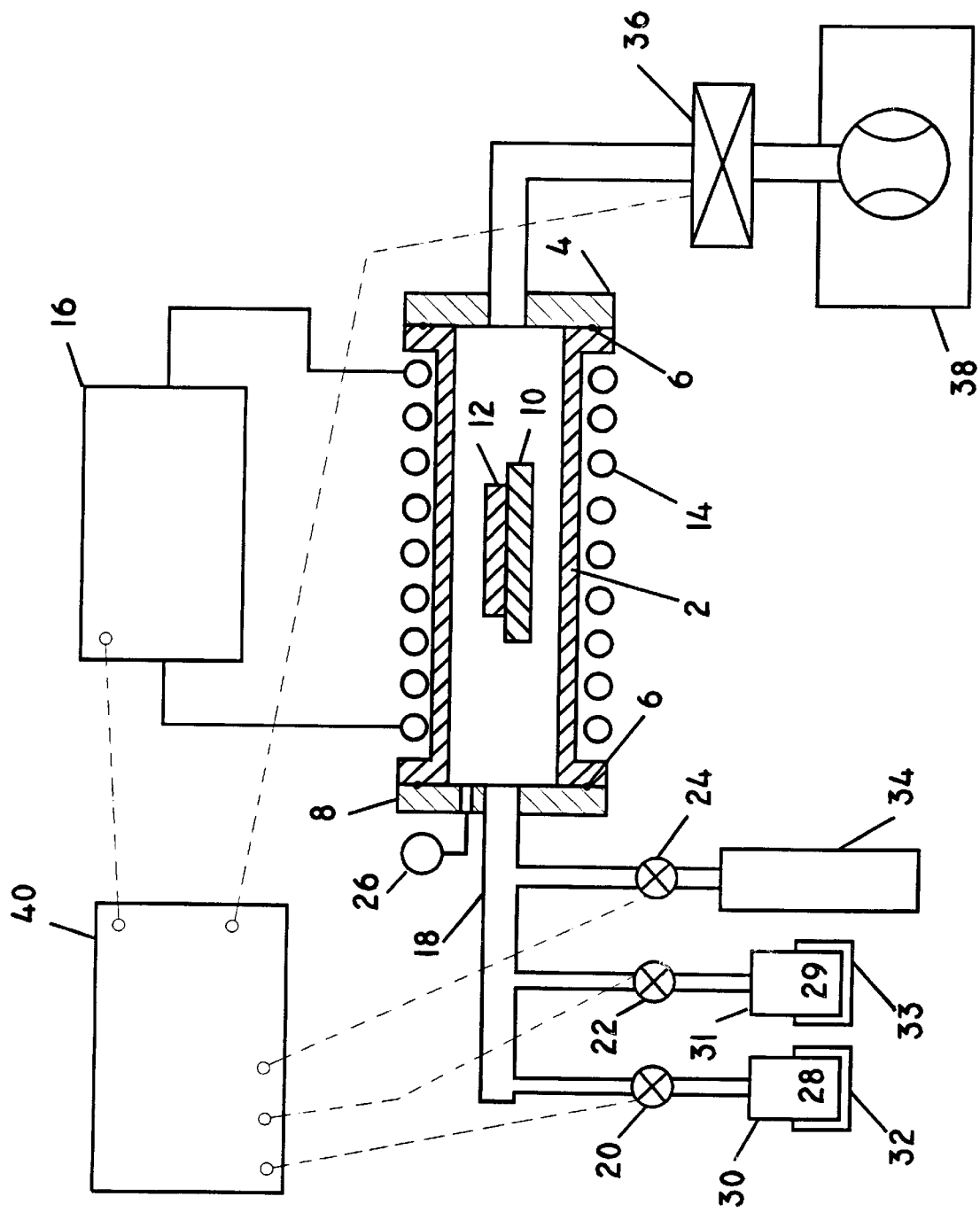
FIG. 1 is a schematic drawing of a sequential CVD reactor, suitable for the deposition of films that are not electrically conducting, constructed in accordance with one embodiment of the present invention.

FIG. 1 is a cross-section view of a reactor vessel 2 made of a non-conducting dielectric ceramic (e.g. a quartz cylinder) which is suitable for the deposition of a non-electrically conducting film on a non-electrically conducting part. The reactor vessel 2 forms a chamber closed at one end by a flange 8, through which gases are introduced, and closed at the other end by a flange 4 which connects to a vacuum pump 38 through a pneumatically operated solenoid gate valve 36. Each flange has an O-ring seal 6 to allow vacuum operation. The part 12 is placed in the reactor vessel 2 on a non-electrically conducting part holder 10. A vacuum gage 26 monitors the chamber pressure during operation. A first reactant 28 is introduced as a gas into the chamber by evaporating a liquid or solid contained in bottle 30 by temperature controller 32 to provide adequate vapor pressure for delivery into the chamber. In many situations, the temperature controller 32 will provide heat to the first reactant in the bottle 30. However, in others the controller may cool the first reactant 28 in the bottle 30.

The first reactant 28 will be a compound having the elements of the monolayer to be formed on the part 12 such as the first reactants listed below in Examples 1–7. The first reactant 28 is introduced into the reactor vessel 2 through solenoid operated pneumatic valve 20 by a manifold 18. FIG. 1 illustrates a system with two bottles 30 and 31, each containing a first reactant 28 and 29, however, the type of film to be formed will determine the number of reactants and bottles. For example, if a ternary film is desired, the system will include three bottles and three valves. A conventional digital microcontroller 40 sequences the opening and closing of the valves 20 and 22 to deliver the first reactants to the chamber at the appropriate times as illustrated in FIG. 2.

Referring to FIG. 1, during a typical operation, a monolayer of the first reactant is deposited on the part 12 to be coated by exposure to the first reactant 28 in vapor phase from the bottle 30. This monolayer is reacted by exposing it to a flux of radicals generated by the action of a solenoidal coil 14, excited by a RF power supply 16, on molecules introduced from a gas bottle 34. The RF power supply 16 can be controlled by the microcontroller circuit 40.

Figure 2:
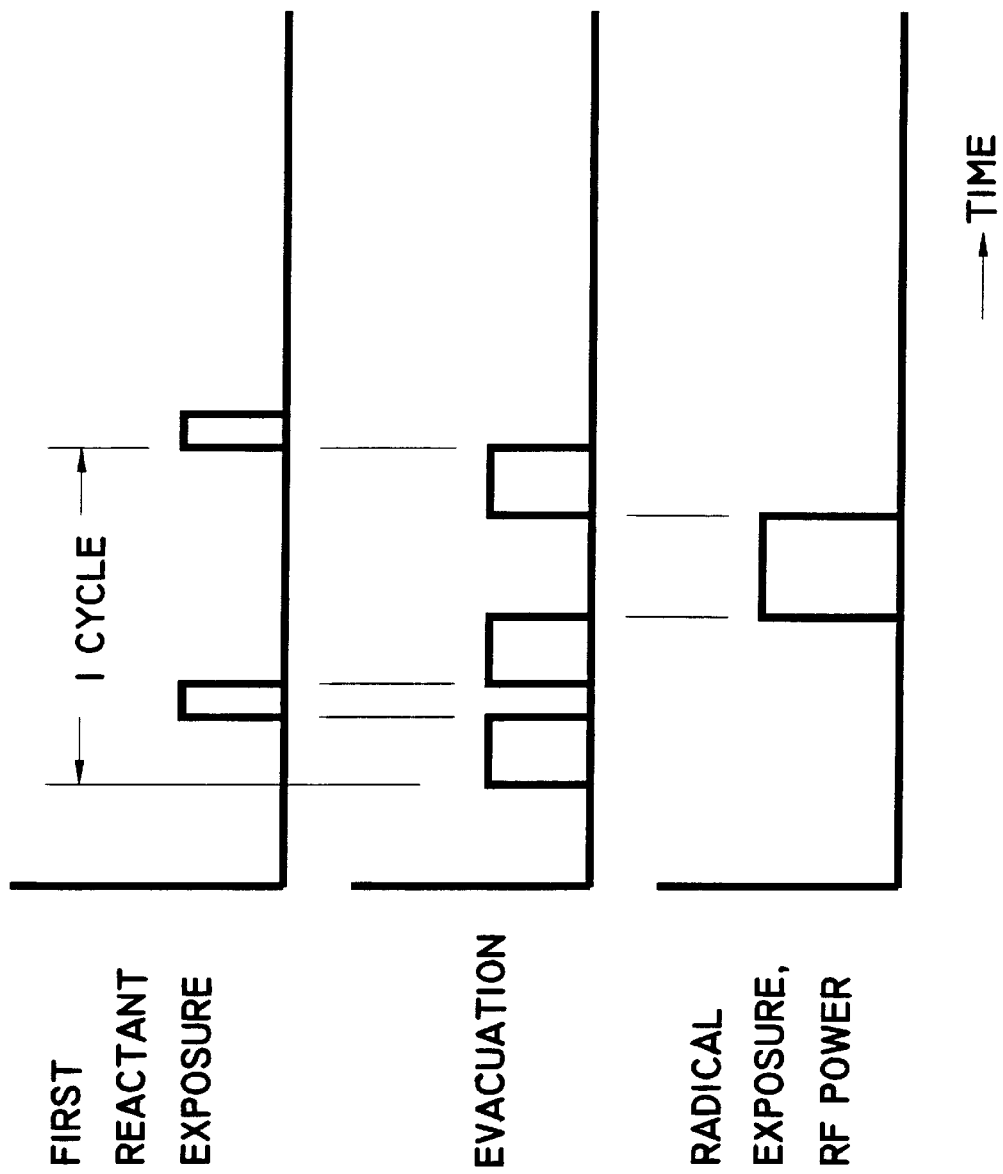
FIG. 2 illustrates a process cycle for the sequential CVD process.

FIG. 2 illustrates a process cycle for forming thin films with reactor vessel shown in FIG. 1. Initially, the vacuum pump 38 evacuates the chamber of the reactor vessel 2. The exhaust gate valve 36 then closes and a valve 20 opens for a short period of time to deliver the first reactant 28 to the reactor vessel 2 in a sufficient amount to form a monolayer of molecules on the part 12 to be coated. After the monolayer is formed, the reactor vessel 2 is again evacuated by the vacuum pump 38 to remove excess first reactant. Next, a second reactant from bottle 34 is delivered into the reactor vessel 2 for a short period of time while a solenoidal coil 14 is excited by the RF power supply 16 generating radicals. This step is carried out for a sufficient period of time to fully react the radicals with the first reactant monolayer. Finally, the reactor vessel 2 is evacuated again by the vacuum pump 38 ending the first cycle. The process cycle can then repeat to form the desired thickness of the film.

Figure 3:
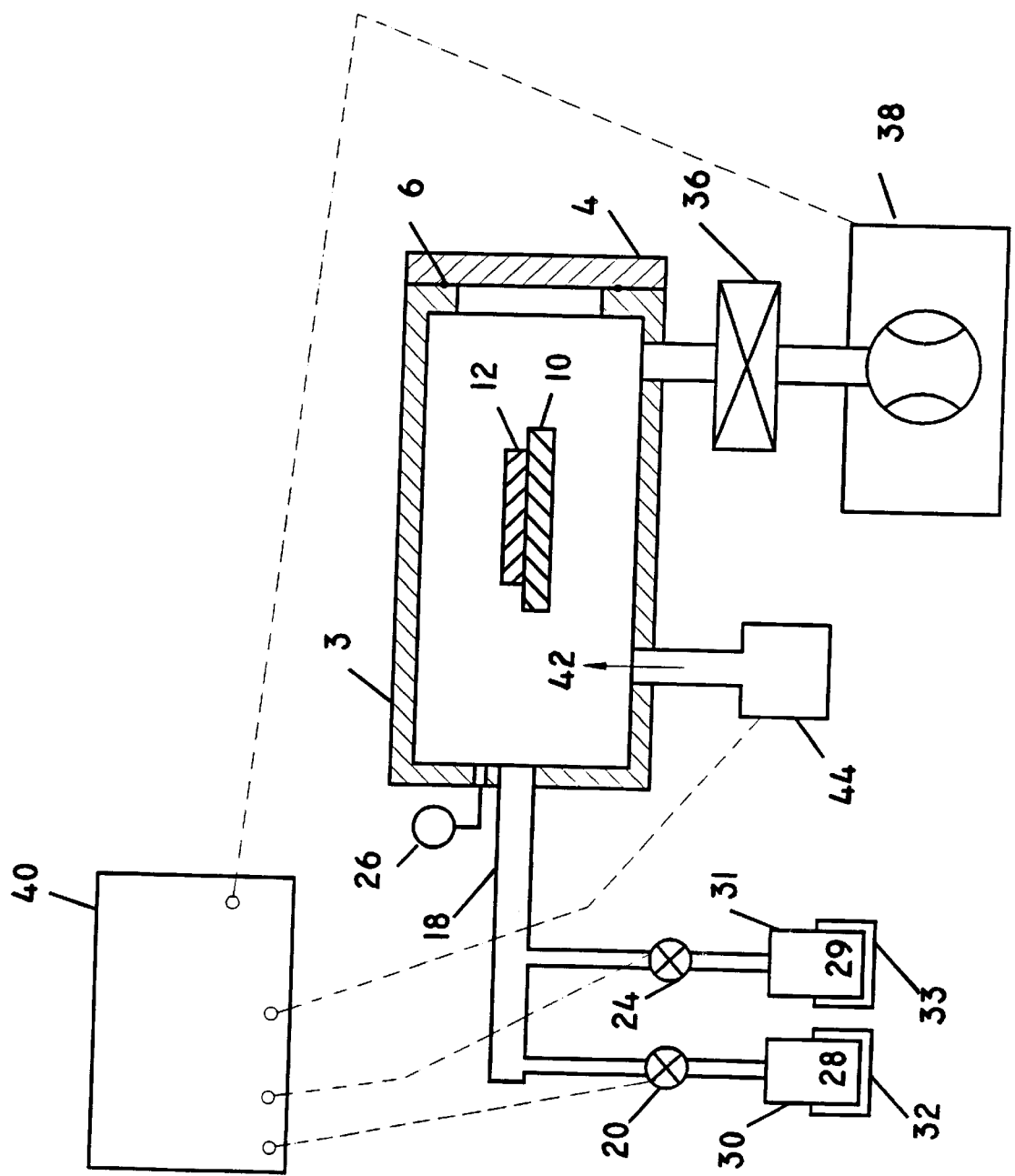
FIG. 3 is a schematic drawing of a sequential CVD reactor, suitable for the deposition of any film, conducting or non-conducting, constructed in accordance with an embodiment of the present invention.

If the film to be deposited is electrically conducting, reactor vessel 2 will be coated by a conducting film which eventually shields out the exciting electric field provided by the solenoidal coil 14. To avoid unnecessary reactor vessel cleaning, in another embodiment, the present invention provides the reactor vessel 3 as shown in FIG. 3. The exhaust flange 4 provides access to the interior of the reactor vessel 3. The flow of second reactant 42 is generated in a radical generator 44 which is attached to the wall of the reactor vessel 3. As before the first reactant 28 is provided from the bottle 30 and introduced to the reactor vessel 3 through the valve 20 and the manifold 18. In this embodiment, the part holder 10 can be either a metal or a ceramic. Again the microcontroller 40 controls all valves and the radical generator 44.

The radical generator 44, suitable for use with the reactor vessel 3, shown in FIG. 3, can take on many well known arrangements. One arrangement is to use a miniaturized version of the quartz tube 2 and RF coil 14 described in FIG. 1. In this arrangement, the only modification is to provide an end plate with a small hole in it, so that the radicals can flow rapidly into the reactor vessel 3 through such a nozzle. One illustration of a suitable end plate with a hole in it serving as a nozzle is shown in FIG. 1, as a stainless steel anode, in a paper by A. Sherman, *In situ Removal of Native Oxide from Silicon Wafers*, J. Vac. Sci. Technol. Vol. B8(4), 656 (July/August 1990) which paper is incorporated by reference here in its entirety. This paper also describes generating hydrogen radicals using a hollow cathode DC discharge chamber. Other alternatives are reviewed for hydrogen radical generation in a recent paper by V. M. Bermudez, *Simple, Efficient Technique for Exposing Surfaces to Hydrogen Atoms*, J. Vac. Sci. Technol. Vol. A14, 2671 (1996). Similar techniques can be also used to generate any of the radicals that might be needed to form the elemental films described herein.

Concerns about the uniformity of distribution of radicals should not control the type of radical generator 44 to be employed. As long as sufficient radicals are generated to react the first reactant, any excess radicals play no role in the film formation. More important considerations relate to avoiding the introduction of contaminants, the cost of the radical generator, and simplicity of its operation. Also, the reaction between any one of the first reactants adsorbed on the part surface and the radical flux to the part, should be rapid and independent of surface temperature. Therefore, it should be possible to carry out these thin film depositions at lower temperatures than in conventional sequential chemical vapor deposition processes which are typically carried out at 300–600° C.

EXAMPLE 1

Deposition of thin films of silicon dioxide can be carried out with a silicon precursor, such as dichlorosilane which can be reduced to elemental silicon by a flux of hydrogen atoms. S. M. Bedair, *Atomic Layer Epitaxy Deposition Process*, J. Vac. Sci. Technol. B 12(1), 179 (1994). It should also be possible to deposit elemental silicon from other precursors (e.g., silane, tetramethylsilane) and atomic hydrogen. The resulting silicon can then be converted to silicon dioxide by exposure to oxygen. In this way a silicon dioxide film can be grown monolayer by monolayer. Another way to grow this film would be to use a silicon precursor that already contains oxygen. For example, one could use tetraethoxysilane and reduce it with oxygen atoms.

EXAMPLE 2

In one embodiment, the present invention provides a process for coating a part with an elemental metal film. For brevity sake, we will limit the discussion to a titanium metal film. In this example, the first reactant could be titanium tetrachloride which could be introduced into the reactor at a low pressure so that a monolayer adsorbs to the surface of the part. Next, any excess titanium tetrachloride in the reactor chamber is pumped out. In order to form pure titanium films, we could then expose the surface to low pressure hydrogen in atomic form. The hydrogen atoms will react with the chlorine in the titanium tetrachloride monolayer to form HCl. The HCl vapor can then be exhausted by a vacuum pump, and a monolayer of titanium will be left behind. The thickness of the titanium metal film is determined simply by the number of process cycles carried out. By this process it is possible to grow a film of any element that is solid at room temperature.

Deposition of thin titanium plus titanium nitride compound films could be derived from titanium tetrachloride and hydrogen atoms to yield the pure titanium, followed by exposure to nitrogen atoms to form the nitride. Alternately, we could expose titanium tetrachloride to NH radicals to produce titanium nitride films directly. Again, if we wish to use a precursor that contains both the titanium and nitrogen atoms, such as tetrakis(diethylamino)titanium or tetrakis (dimethylamino)titanium, we could reduce a monolayer of either of these species with hydrogen atoms or HN radicals to form titanium nitride.

EXAMPLE 3

The present invention provides for growing a film with three or more elements such as an oxynitrides by sequentially growing an oxide and then growing a nitride. In fact, there would be no difficulty in growing ternary compounds such as tantalum/silicon/nitrogen which is a good diffusion barrier film for advanced integrated circuits.

Various binary and ternary silicides can be formed by depositing one, or more, metallic or semiconductor elements and nitriding the layer with nitrogen atoms. For example, we could deposit a monolayer of pure silicon, and then a monolayer of pure titanium. If the resulting monolayer of titanium silicide were then nitrided with a flux of nitrogen atoms, we could have a titanium/silicon/nitrogen ternary compound. Also, the stoichiometry of the compound film could be changed simply by changing the number of cycles used for any of the elements. For example, titanium disilicide ($TiSi_2$) could be formed from two silicon cycles for each titanium cycle.

EXAMPLE 4

Deposition of aluminum films doped with copper and silicon could be formed from triisobutylaluminum, copper (II)acetylacetonate[$Cu(acac)_2$], and tetramethylsilane each reduced in turn by hydrogen atoms. The percentages of copper and/or silicon dopants could be adjusted by controlling how many layers of each element are deposited. For example, a two percent doping level of copper is achieved by depositing one layer of copper for every 50 layers of aluminum.

EXAMPLE 5

If we take full advantage of the ability of the sequential CVD process to conformally coat parts that are very porous, we could fabricate a number of important composite materials. For example, we could grow a carbon layer from methane and hydrogen atoms. This layer could then be converted to a silicon carbide by growing a silicon layer as described in Example 1. This silicon carbide coating could be used to coat a carbon fiber preform until a solid silicon carbide body is formed reinforced with carbon fibers. The carbon fibers would give the part great strength, and the silicon carbide would allow it to be used at high temperatures in air. Ceramic composites using alumina whiskers could be formed by growing aluminum oxide on a preform made from such fibers. Metallic composites could be also prepared using metallic fiber preforms and a sequential CVD to grow metal on the preform.

EXAMPLE 6

We now know that good quality aluminum oxide thin films can be grown at moderate temperatures by H. Kumagai, K. Toyoda, M. Matsumoto and M. Obara, *Comparative Study of $Al_2O_3$ Optical Crystalline Thin Films Grown by Vapor Combinations of $Al(CH_3)_3/N_2O$ and $Al(CH_3)_3/H_2O_2$*, Jpn. J. Appl. Phys. 32 6137 (1993) by sequential CVD. It is, therefore, possible to coat anodized aluminum parts with this highly conformal layer. The earlier CVD processes could not be used because they had to be operated at temperatures higher than the melting point of aluminum. One approach would be to use known methods of sequential CVD to coat aluminum. An alternative approach would be to take advantage of the process described in the present invention, where we can form monolayers of pure aluminum and then oxidize these layers with oxygen atoms. For example, we could reduce trimethylaluminum with hydrogen atoms to form the aluminum layer. This layer will readily oxidize when exposed to oxygen. If the aluminum were initially anodized, the sequential chemical vapor deposition film will fill in any defects or pinholes.

EXAMPLE 7

Joining two pieces of ceramic at low temperature with a pure ceramic material, is a process that has some unique advantages. For example, the temperature tolerance of the joined parts will be as high as the original ceramic parts. Also, no new material is added to the structure, so the resulting joined part is of high purity, and just as chemically inert as the original ceramics. Such a process does not exist today. For example, two pieces of aluminum oxide could be joined by growing aluminum oxide, as described in Example 6, on the two adjacent parts.

While the invention has been illustrated in particular with respect to specific methods of carrying out the same, it is apparent that variations and modifications can be made. It will be apparent from the preceding that the present invention significantly advances the state of the art in the technology of sequential chemical vapor deposition of thin films, and describes several commercially significant applications for films deposited by the method of this invention. The process of this invention is unique in that it allows, for the first time, the deposition of perfectly conformal and very pure films of any composition at low temperatures.

The commercial applications of the films deposited by the technique of this invention should not be limited to this method of creating these films. In some instances, films grown by known sequential CVD techniques, without resort to radicals may be adequate depending on the application.

While the invention has been particularly shown and described with reference to preferred embodiments thereof, it will be understood by those skilled in the art that the foregoing and other changes in the form and details may be made therein without departing from the spirit or scope of the invention.

What is claimed is:

1. A process of growing a thin film by a sequential chemical vapor deposition process, comprising the steps of:
    placing a part in a chamber;
    evacuating the chamber of gases;
    exposing the part to a gaseous first reactant, including a non-semiconductor element of the thin film to be formed, wherein the first reactant adsorbs on the part;
    evacuating the chamber of gases;
    exposing the part, coated with the first reactant, to a gaseous second reactant of radicals, wherein the radicals convert the first reactant on the part to one or more elements, wherein a thin film is formed; and
    evacuating the chamber of gases.

2. The process of claim 1, wherein the parts to be coated are maintained at temperatures up to 500° C. in the chamber.

3. The process of claim 1, wherein the first reactant includes a halogen atom.

4. The process of claim 1, wherein the first reactant is a metal-organic molecules including an elemental metal species.

5. The process of claim 1, wherein the radicals of the second reactant are selected from the group consisting of oxygen atoms, nitrogen atoms, hydrogen atoms, OH molecules, NH molecules or a combination thereof.

6. The process of claim 1, wherein the radicals of the second reactant are generated in a radical generator in communication with the chamber.

7. The process of claim 1, wherein the radicals of the second reactant are generated by surrounding the chamber with an RF excitation coil, wherein the thin film being formed is a dielectric material.

8. The process of claim 1, wherein the first reactant is tetraethoxysilane and the second reactant is atomic oxygen which converts the first reactant to a thin film of silicon dioxide.

9. The process of claim 1, wherein the first reactant is titanium tetrachloride and the second reactant is atomic hydrogen which converts the first reactant to a thin film of titanium.

10. The process of claim 1, wherein the first reactant is a titanium organometallic compound and the second reactant are hydrogen atoms or HN molecules which convert the first reactant to a thin film of titanium nitride.

11. The process of claim 1, wherein the first reactant is an aluminum compound and the second reactant is atomic hydrogen which converts the first reactant to a thin film of aluminum.

12. The process of claim 1, wherein the first reactant is a copper compound and the second reactant is atomic hydrogen which converts the first reactant to a thin film of copper.

13. A process of coating a fiber preform with a conformal thin film by a sequential chemical vapor deposition process to form a low porosity structure of high strength, comprising the steps of:
    forming a porous material in a predetermined shape;
    inserting the porous material in a chamber;
    evacuating the chamber of gases;
    exposing the porous material to a first reactant, including one or more elements of the film to be formed, wherein the first reactant adsorbs on the part;
    evacuating the chamber of gases; and
    exposing the porous material to a second reactant which converts the first reactant to a thin film.

14. A process of coating aluminum with aluminum oxide, formed by a sequential chemical vapor deposition process, so that the coating is highly conformal and provides protection against corrosion of the aluminum, comprising the steps of:
    inserting the aluminum part in a chamber;
    evacuating the chamber of gases;
    exposing the aluminum to a first reactant, including aluminum as an element, wherein the first reactant adsorbs on the part;
    evacuating the chamber of gases; and
    exposing the aluminum coated with the first reactant to a second reactant which oxidizes and converts the first reactant to a thin film of aluminum oxide.

15. A process of growing a thin layer of ceramic material between adjacent parts to cause the parts to be joined for a ceramic brazing process, comprising the steps of:

inserting the ceramic parts in a chamber;

evacuating the chamber of gases;

exposing the ceramic parts to a first reactant which adsorbs on the ceramic parts;

evacuating the chamber of gases; and exposing the ceramic parts coated with the first reactant to a second reactant which converts the first reactant to a thin film of ceramic material.

16. A process of growing a thin film by a sequential chemical vapor deposition process, comprising the steps of:

placing a part in a chamber;

evacuating the chamber of gases;

exposing the part to a gaseous first reactant, containing a metallic element, wherein the first reactant adsorbs on the part;

evacuating the chamber of gases;

exposing the part, coated with the first reactant, to a gaseous second reactant of radicals, wherein the radicals convert the first reactant on the part to a metallic element; and evacuating the chamber of gases.

17. The process of claim 16, wherein the first reactant is a metal selected from a group consisting of aluminum, copper, tantulum, titanium, and tungsten, and the second reactant is a radical selected from a group consisting of hydrogen, nitrogen, oxygen, or a combination thereof.

18. A process of growing a thin film by a sequential chemical vapor deposition process, which comprises:

placing a part in a chamber;

evacuating the chamber of gases;

exposing the part to a gaseous first reactant selected from the group consisting of Si and Ge, wherein the first reactant adsorbs on the part;

evacuating the chamber of gases;

exposing the part, coated with the first reactant, to a gaseous second reactant of radicals selected from the group consisting of O and N, wherein the radicals convert the first reactant on the part to a thin film selected from the group consisting of silicon nitride, silicon oxide, germanium nitride, germanium oxide; and evacuating the chamber of gases.

19. A process of growing silicon dioxide thin film by a sequential chemical vapor deposition process, which comprises:

placing a part in a chamber;

evacuating the chamber of gases;

introducing a first reactant of gaseous silicon compound not containing oxygen into the chamber to expose the part to the first reactant, wherein the first reactant includes the silicon of the thin film to be formed, so that the first reactant adsorbs on the part;

evacuating the chamber of gases;

exposing the part, coated with the first reactant to hydrogen atoms, wherein the hydrogen atoms reduce the first reactant on the part to silicon;

evacuating the chamber of gases; and exposing the part coated with silicon to oxygen, wherein the oxygen converts the silicon on the part to silicon dioxide.

20. A process of growing silicon dioxide thin film by a sequential chemical vapor deposition process, which comprises:

placing a part in a chamber;

evacuating the chamber of gases;

introducing a first reactant of gaseous silicon precursor containing oxygen into the chamber to expose the part to the first reactant, wherein the first reactant includes the silicon and oxygen of the thin film to be formed, so the first reactant adsorbs on the part;

evacuating the chamber of gases;

exposing the part coated with the first reactant to oxygen atoms, wherein the oxygen atoms convert the first reactant on the part to silicon dioxide; and evacuating the chamber of gases.

* * * * *